(12) United States Patent
Entley et al.

(10) Patent No.: US 7,479,191 B1
(45) Date of Patent: Jan. 20, 2009

(54) METHOD FOR ENDPOINTING CVD CHAMBER CLEANS FOLLOWING ULTRA LOW-K FILM TREATMENTS

(75) Inventors: William R. Entley, San Jose, CA (US); John G. Langan, Pleasanton, CA (US); Amith Murali, Fremont, CA (US); Kathleen Bennett, Gilroy, CA (US)

(73) Assignee: Novellus Systems, Inc., San Jose, CA (US)

( * ) Notice: Subject to any disclaimer, the term of this patent is extended or adjusted under 35 U.S.C. 154(b) by 770 days.

(21) Appl. No.: 11/112,741

(22) Filed: Apr. 22, 2005

(51) Int. Cl.
*B08B 3/12* (2006.01)
*B08B 6/00* (2006.01)
*B08B 7/00* (2006.01)
*B08B 7/02* (2006.01)

(52) U.S. Cl. .......................... 134/1; 134/1.1
(58) Field of Classification Search ............. 134/1, 134/1.1
See application file for complete search history.

(56) References Cited

U.S. PATENT DOCUMENTS

| | | | |
|---|---|---|---|
| 4,787,957 A | 11/1988 | Barkanic et al. | |
| 5,160,402 A | 11/1992 | Cheng | |
| 5,413,670 A | 5/1995 | Langan et al. | |
| 5,454,903 A | 10/1995 | Redeker et al. | |
| 5,846,373 A * | 12/1998 | Pirkle et al. ............ | 156/345.25 |
| 5,888,337 A | 3/1999 | Saito | |
| 5,986,747 A | 11/1999 | Moran | |
| 6,060,397 A * | 5/2000 | Seamons et al. ........... | 438/694 |
| 6,067,999 A | 5/2000 | Hines et al. | |
| 6,124,927 A | 9/2000 | Zhong et al. | |
| 6,492,186 B1 | 12/2002 | Han et al. | |
| 6,534,007 B1 | 3/2003 | Blonigan et al. | |
| 6,547,458 B1 | 4/2003 | Janos et al. | |
| 6,569,257 B1 | 5/2003 | Nguyen et al. | |
| 2004/0045577 A1* | 3/2004 | Ji et al. ......................... | 134/1.1 |
| 2004/0261815 A1* | 12/2004 | Pavone ...................... | 134/1.3 |
| 2005/0161060 A1* | 7/2005 | Johnson et al. .............. | 134/1.1 |

OTHER PUBLICATIONS

U.S. Appl. No. 11/112,742, Office Action mailed May 15, 2007.
Entley, et al. "Optimizing utilization efficiencies in electronegative discharges: The importance of the impedance phase angle", Journal of Applied Physics, vol. 86, No. 9, Nov. 1, 1999, pp. 4825-4835.

(Continued)

*Primary Examiner*—Duy-Vu N Deo
(74) *Attorney, Agent, or Firm*—Weaver Austin Villeneuve & Sampson LLP

(57) ABSTRACT

Methods of determining the endpoint of cleaning residues from the internal surfaces of a chemical vapor deposition chamber are described. The methods are especially useful for determining when organic-based residues deposited from an ultra low-k film precursor deposition are removed from the chamber. The methods involve cleaning the chamber with a plasma comprising fluorine and oxygen while monitoring the intensity of the optical emission lines of one or more atomic or molecular species that correlate to the removal of the organic-based residues. Techniques and apparatuses for monitoring different appropriate emission lines are described. Methods of the invention can be used to prevent particle contamination during CVD operations following ultra low-k film precursor depositions and improve wafer throughput in manufacturing environments.

19 Claims, 10 Drawing Sheets

OTHER PUBLICATIONS

Entley, et al., "CVD Chamber Cleans Following Ultra Low-K Film Treatments", Novellus Systems, Inc., U.S. Appl. No. 11/112,742, filed Apr. 22, 2005, pp. 1-28.

Vitale, et al. "Etching chemistry of benzocyclobutene (BCB) low-$k$ dielectric films in $F_2+O_2$ and $Cl_2+O_2$ high density plasmas", J. Vac. Sci. Technol. A, vol. 18, No. 6, Nov./Dec. 2000, pp. 2770-2778.

* cited by examiner

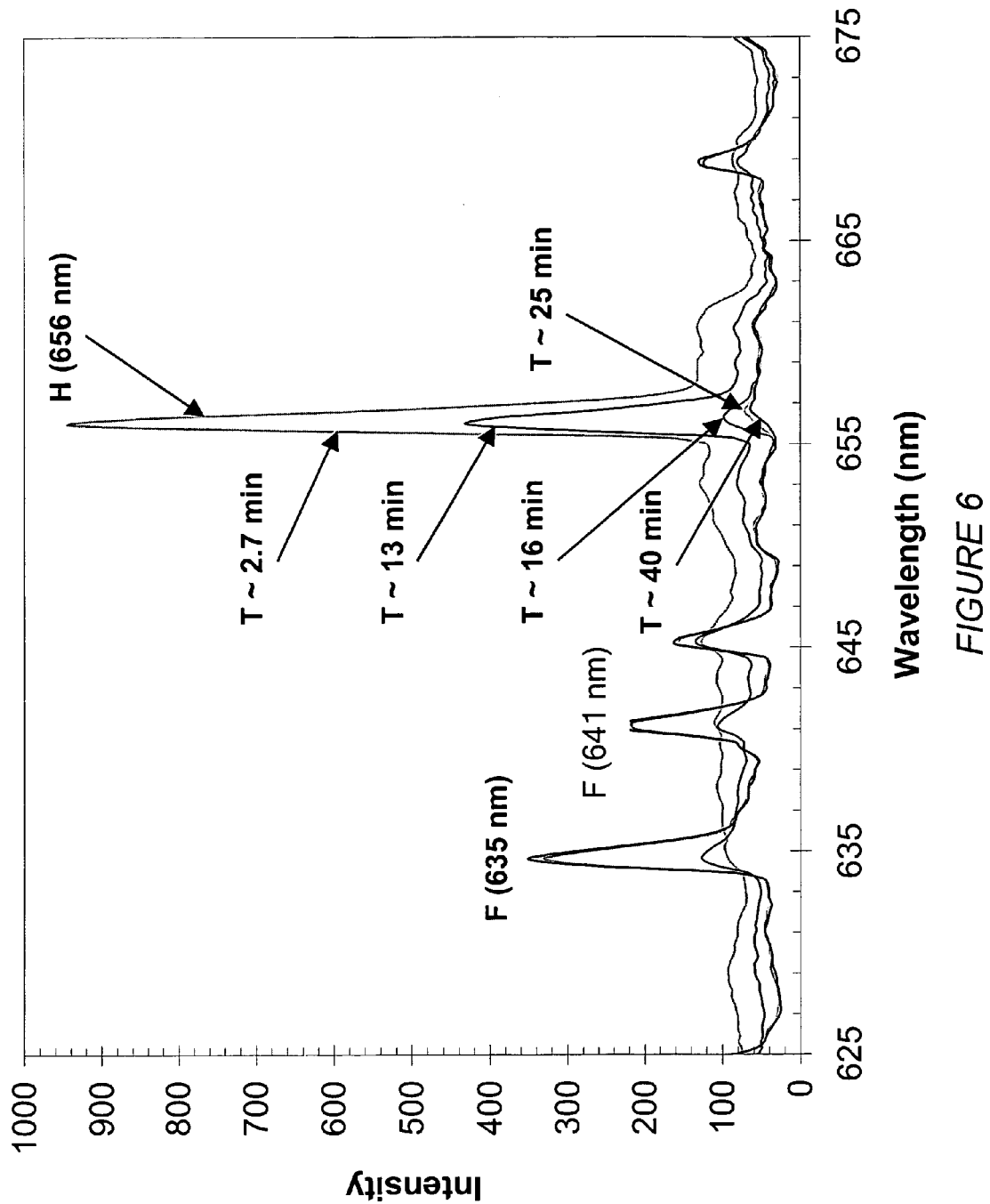

METHOD FOR ENDPOINTING CVD CHAMBER CLEANS FOLLOWING ULTRA LOW-K FILM TREATMENTS

CROSS-REFERENCE TO RELATED APPLICATIONS

This application is related to U.S. patent application Ser. No. 11/112,742, filed on the same date as the instant application, titled "CVD CHAMBER CLEANS FOLLOWING ULTRA LOW-K FILM TREATMENTS," by Entley et al. as inventors, which application is incorporated herein by reference in its entirety for all purposes.

BACKGROUND

This invention relates to methods for cleaning residues from the internal surfaces of chemical vapor deposition (CVD) chambers. The methods described are especially useful in integrated circuit manufacturing. Methods of the invention focus on determining the endpoint of cleaning a CVD chamber, especially when cleaning residues from the internal surfaces of the chamber following the deposition of ultra low dielectric constant films deposited using a silicon-based dielectric precursor and an organic-based porogen. The methods involve cleaning the chamber with a plasma while monitoring the intensity of one or more of the optical emission lines corresponding to removal of organic-based residue.

The use of low dielectric constant (low-k) materials is widespread in the integrated circuit manufacturing industry. Low-k films are commonly used as inter-metal and/or inter-layer dielectrics because these films reduce delay in signal propagation due to capacitive effects. The lower the dielectric constant of the dielectric film, the lower the capacitance of the dielectric film and the lower the RC delay of the integrated circuit.

Low k dielectrics are conventionally defined as those materials that have a dielectric constant lower than that of silicon dioxide, that is k<4. However, with ever increasing technology demands, present efforts are focused on developing low-k dielectric materials with k less than 2.5, commonly referred to as ultra low-k (ULK) materials. One method of obtaining ULK materials involves forming porous carbon-doped oxide (CDO) films. These methods typically involve forming a composite film (referred to herein as a "precursor film") containing two components: a porogen (typically an organic material) and a structure former or dielectric material (e.g., a silicon oxide containing material). Once the precursor film is formed on the substrate, the porogen component is removed, leaving a structurally intact porous dielectric matrix on the substrate. The introduction of air voids, combined with the carbon doping of the silicon oxide network, substantially lowers the overall dielectric constant of the film to produce the ULK film.

Common techniques for forming the precursor film include chemical vapor deposition (CVD) methods, including plasma enhanced CVD (PECVD) methods, wherein porogen precursor and structure former precursor compounds are co-deposited on a substrate. During this deposition process, residues will tend to adhere to the internal walls and surfaces of the reaction chamber. These residues, generally composed of silicon-based species and organic-based species, can build up on the inside of the chamber and can dissolve, detach or otherwise disperse through the chamber during subsequent processing, resulting in substrate contamination and yield loss. Consequently the residues that accumulate on the interior surfaces of the CVD chamber must be periodically removed. This accumulated deposition residue is typically removed from the interior surfaces of the CVD chamber using two types of cleaning procedures, plasma cleaning procedures and wet cleaning procedures.

Plasma cleaning procedures can be done using either in situ chamber cleans or remote chamber cleans. In in situ chamber cleans, the chamber clean chemicals are introduced into the CVD chamber in a gaseous state and plasma excitation within the CVD chamber is used to dissociate the chamber clean chemicals into reactive radicals and ions. In remote cleans, an independent plasma source is used to dissociate the gaseous chamber clean chemicals into reactive radicals and ions outside the CVD chamber, and the dissociated chamber clean chemicals are then introduced into the CVD chamber. In both in situ and remote chamber cleans, the reactive species in the CVD chamber react with the accumulated deposition residue to form gaseous products that are evacuated from the chamber.

After a number of plasma cleaning cycles, the performance of the CVD process degrades and a wet clean is required. In wet cleaning procedures the CVD chamber is vented to atmosphere and the interior surfaces of the reactor are physically scrubbed using appropriate cleaning solutions and/or abrasives. This type of cleaning procedure is time consuming, labor intensive, and requires reconditioning of the chamber once completed. Consequently improvements in the plasma cleaning procedure that extends the intervals between required wet cleans are critical to maintaining the highest possible CVD chamber throughput. Improvements in the plasma cleaning procedure can also result in a decrease in the degradation of the interior reactor surfaces and consequently, extended hardware lifetimes.

Oxidative in situ plasma methods have commonly been used for cleaning CVD chambers. These methods involve introducing an oxidizing agent such a fluorine-containing gas into the chamber and implementing a plasma to create strongly reactive ions and radicals. These strong reactive agents breakdown the residues that have built up on the internal surfaces of a chamber to form volatile species that are pumped away by vacuum. During the plasma cleaning process, it is important to determine when all of the residues have been removed. If the plasma process is not applied for a long enough period of time, residues will persist within the chamber. The accumulation of unremoved deposition residue can result in particle contamination issues and more frequent wet cleans. If the plasma process is applied for a longer period of time than necessary, overcleaning of the CVD chamber will result. Overcleaning the CVD chamber will result in premature degradation of the interior CVD chamber surfaces, particle contamination issues resulting from overexposure of the interior chamber surfaces to the cleaning plasma, and more frequent wet cleans. In addition to impacting wafer throughput, overcleaning the CVD chamber will also waste costly chemicals. Consequently one of the most critical steps in improving the plasma cleaning procedure is identifying a method that allows the endpoint of the plasma cleaning process to be correctly determined.

Some currently available techniques to determine the endpoint of a plasma cleaning process are described in U.S. Pat. Nos. 6,534,007 and 5,846,373. One method involves monitoring the ratio of the intensity of emission lines of a fluorine radical and a background gas (e.g., argon or nitrogen) during the plasma cleaning process. The other method involves monitoring the emission intensity of NO. These methods, however, while they may be effective for determining the endpoint of removing silicon-based residues, are completely ineffective for determining the endpoint of cleaning of both the silicon-based and the organic-based residues that result from the deposition of ULK precursor films. In particular, it has been found that using techniques appropriate for determining the endpoint for removing silicon-based resides, when applied to determining the endpoint for cleaning chambers after a ULK precursor deposition process, results in significant undercleaning of the CVD chamber and the accumulation of unremoved deposition residue inside the chamber.

What is needed therefore are improved methods for determining the endpoint for cleaning CVD chambers after a ULK precursor film deposition process.

SUMMARY

The present invention addresses this need by providing improved methods of determining the endpoint for cleaning a CVD chamber. In particular, methods involve (a) providing a CVD chamber with a device configured to monitor optical emission intensities from within the CVD chamber, the chamber having silicon-based (from a structure former or dielectric precursor) and organic-based (from a porogen precursor) ultra-low k (ULK) precursor film residues on its internal surfaces, (b) exposing the residues on the interior surfaces of the CVD chamber to an oxidizing plasma treatment employing oxygen-containing and fluorine-containing source gases, (c) monitoring the intensity of one or more optical emission lines of one or more atomic and/or molecular species that correlate to the removal of the organic-based porogen residues during the plasma exposure, and (d) determining the substantially complete removal of residues when the optical emission intensity of the one or more species reaches a steady state level.

Fluorine and Oxygen-containing feed gas compositions described herein for in situ chamber cleans not only effectively remove the residues resulting from processing of an ultra low-k (ULK) precursor film from the deposition chamber, but do so rapidly and in a single operation. Suitable such compositions have an etch rate of at least 1100 Å/min. For example, feed gas mixtures composed of about 20 to 35 mol % $NF_3$ in a balance of $O_2$ are effective at removing the residue from the chamber following the deposition of ULK materials with a high etch rate (e.g., at least 1100 Å/min, for example between 1100 to 15000 Å/min). Other suitable gas compositions are comprised of a fluorine containing etchant, such as $F_2$, $CF_4$, $C_2F_6$, $C_3F_8$, $C_4F_8$ and/or $C_4F_8O$, or combinations thereof, in a balance of $O_2$, $NO_2$ and $O_3$, or combinations thereof, and are also effective at rapidly removing the residue from the chamber following the deposition of ULK materials with a high etch rate in a single operation. In a specific embodiment, a 33 mol % $NF_3/O_2$ gas mixture is used for an in situ chamber clean following deposition of a ULK material.

The emission lines for any suitable atomic and/or molecular species that correlate to the removal of organic-based components of the ULK film residues can be monitored during the plasma treatment. Preferably, the atomic and/or molecular species can be correlated to products, or are actual products, of the oxidation of the organic-based residues. It has been found that emission lines of atomic hydrogen can be correlated to products of the oxidation of the organic-based residues and the emissions lines of CO correspond to an actual product of the oxidation of the organic-based residue. Thus, in preferred embodiments of the invention, the emission lines of atomic hydrogen and/or carbon monoxide are monitored during the plasma treatment. More preferably the emission lines of atomic hydrogen are monitored during the plasma treatment. Note that as the organic-based residues are oxidized and removed from the chamber during the plasma process, the products of the oxidizing plasma process will decrease. Thus the emission lines that correspond to removal of the products will also decrease.

It is generally easier to track the emission lines that correlate to decreasing amounts of products of the plasma process if their production is correlated with the increasing amounts of reactants of the plasma process. Thus, in preferred embodiments, the intensity of one or more emission lines of a reactant of the oxidizing plasma treatment are also monitored. Then the ratio of the intensity of one or more emission lines correlating to removal of the organic-based residues to the intensity of one or more emission lines of a reactant of the oxidizing plasma treatment can be monitored to facilitate determining the substantially complete removal of residues. This emission intensity ratio technique has the advantage of correcting for background drift in the spectrometer that can occur during the plasma process.

Examples of reactants for the oxidizing plasma cleaning process include atomic fluorine and atomic oxygen. Thus, one can monitor the ratio of the intensity of an emission line of atomic hydrogen or carbon monoxide to the intensity of an emission line of atomic fluorine or atomic oxygen. In preferred embodiments, the ratio of the intensity of an emission line of atomic hydrogen to the intensity of an emission line of atomic fluorine or atomic oxygen is monitored.

In some cases, the plasma treatment employs an inert background gas. If so, the intensity of one or more emission lines of a species originating from the inert background gas can also be monitored. Then the ratio of the intensity of one or more emission lines correlating to a product of the oxidation of the organic-based residues to the intensity of one or more emission lines of an atomic species originating from the inert background gas can be monitored to facilitate determining the substantially complete removal of residues. Examples of suitable inert background gases include argon, helium, neon, krypton, or a combination thereof. In one example, the ratio of the intensity of an emission line of atomic hydrogen to the intensity of an emission line of atomic argon is monitored. In addition, the ratio of the intensity of one or more emission lines correlating to a product of the oxidation of the organic-based residues to the intensity of a region of the spectrum with no emission lines can be monitored.

As mentioned previously, methods of the invention are effective for determining the endpoint of CVD chamber cleans after processing ULK precursor films. Also as mentioned previously, for ULK precursor films, the film has a silicon-based (structure former) component and an organic-based (porogen) component. The ULK precursor film is typically formed by co-depositing a structure former precursor and a porogen precursor. For methods of the invention, the porogen may originate from any suitable organic-based porogen precursor. In preferred embodiments, the porogen precursor is a polyfunctional cyclic non-aromatic. Examples of classes of some preferred porogen precursors are alpha terpinenes, limonenes and norbornenes.

Regarding the plasma conditions, in preferred embodiments, the flow rate of oxygen ranges between about 50 sccm and about 10000 sccm and the flow rate of fluorine-containing source gas ranges between about 50 sccm and about 10000 sccm. If an inert background gas is used, the flow rate of the inert background gas is preferably less than or equal to 5% of the total gas flow rate. The chamber pressure during plasma treatment preferably ranges between about 0.3 Torr and about 10 Torr. The plasma is preferably produced using high frequency power of between about 400 Watts and about 10000 Watts, or between about 100 Watts and about 2500 Watts per showerhead. Any device suitable for monitoring the emission intensities may used. In preferred embodiments, an optical emission spectrometer or a multiple photomultiplier tube detector is used.

These and other features and advantages of the invention will be described in detail below with reference to the associated drawings.

BRIEF DESCRIPTION OF THE DRAWINGS

The following detailed description can be more fully understood when considered in conjunction with the drawings in which:

FIG. 6 is an optical emission spectra between 625 nm and 675 nm at various times during a plasma chamber cleaning process showing the change in selected H and F intensity wavelengths as a function of time.

DETAILED DESCRIPTION OF A PREFERRED EMBODIMENT

Introduction

In the following description, numerous specific details are set forth in order to provide a thorough understanding of the present invention, which pertains to determining the endpoint for cleaning residues from a CVD chamber. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Methods of the invention relate to removing silicon-based and organic-based residues from a CVD chamber, particularly, silicon-based and organic-based residues resulting from processing of an ultra low-k (ULK) precursor film. The methods of the invention focus on the cleaning of the CVD chamber and are not limited to any particular methods of ULK film processing. However, it is worth describing some of the details of porous ULK film formation and processing for purposes of understanding some aspects of the invention. These details will be described below.

In this application, the term "wafer" will be used interchangeably with "wafer substrate" and "substrate." One skilled in the art would understand that these terms could refer to a silicon (semiconductor) wafer during any of many stages of integrated circuit fabrication thereon. Also note that the words "film" and "layer" are used interchangeably herein.

Process

Figure 1:
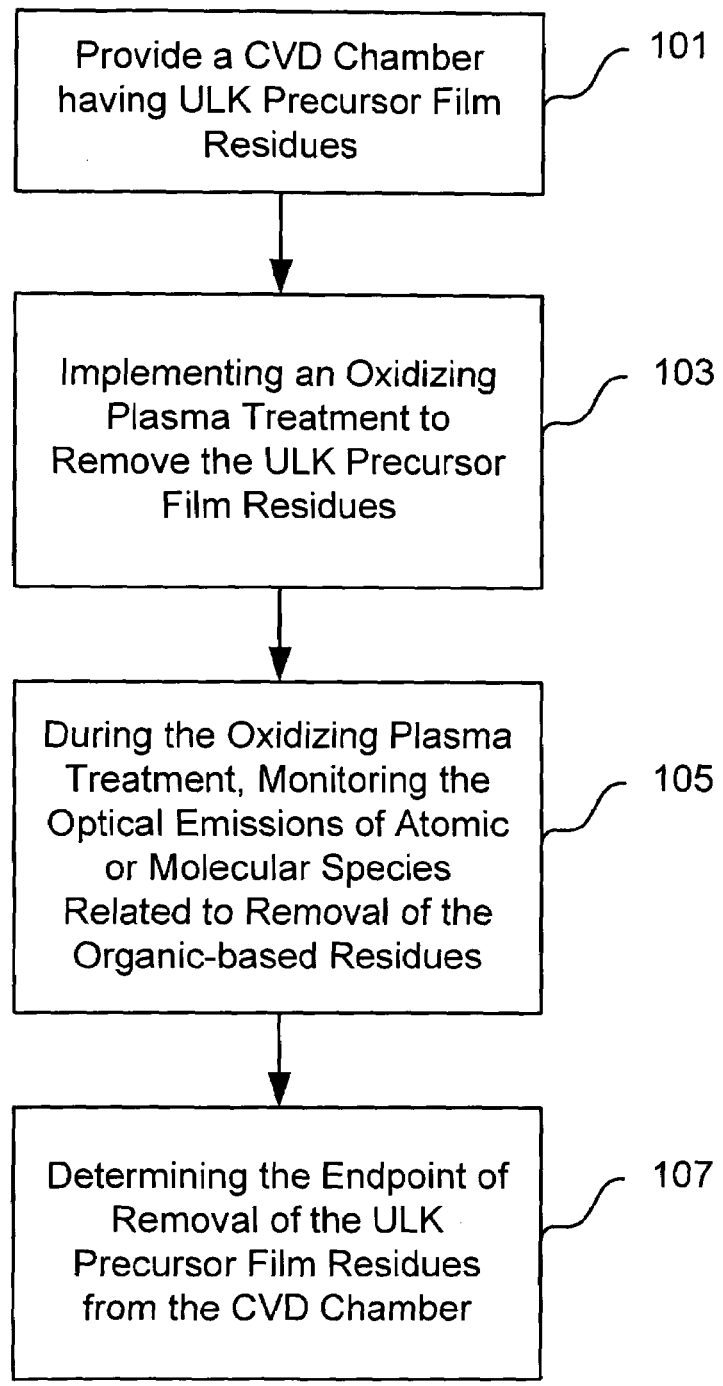
FIG. 1 is a flowchart summarizing stages of a general process and a preferred implementation of the invention for determining the endpoint of cleaning a reaction chamber after depositing a ULK film precursor.

FIG. 1 is flowchart summarizing a high-level process flow of preferred implementations of the invention. The following is a detailed description of the processes outlined in the flowchart. Note that this flowchart is representative of some embodiments of the invention and are not intended to encompass all possible embodiments of the invention.

In FIG. 1, first, as represented by process block 101, a CVD chamber having ULK precursor film residues on the internal surfaces of the chamber is provided. As mentioned previously, these residues comprise silicon-based residues and organic-based residues resulting from processing of a ULK precursor film. To better understand the nature of these residues, some aspects of the porous ULK film formation process will now be described.

As noted above, porous ULK films are commonly generated using porogen technology. This method involves a two-phase technique: first, forming a precursor film that contains a structure former, typically a dielectric material which serves as a backbone of the porous network, and a porogen which coexists with the structure former as a separate phase in the precursor film; and second, removing the porogen from the precursor film to generate porous regions or voids within the dielectric material, leaving a porous dielectric matrix.

In the precursor film formation phase, the structure former and porogen components can originate from two separate types of precursor molecules: a structure former precursor, usually a silicon-containing molecule such as a silane or alkoxysilane; and a porogen precursor, typically a hydrocarbon compound. The structure former precursor and porogen precursor are typically co-deposited in one process. Any suitable deposition technique may be used, including spin-coating processes, print-on, dip coating, thermal process and CVD—particularly plasma enhanced chemical vapor deposition (PECVD). Methods of the invention can be used to detect the endpoint of cleaning a CVD chamber after such a deposition process.

Regarding possible structure former precursors, any chemical compound suitable for forming a dielectric backbone network film may be used. One or more types(s) of structure former precursor compound(s) may be used. In preferred embodiments, the structure former precursor includes silicon and oxygen. In more preferred embodiments, the structure former also includes carbon. Examples of suitable structure former precursors include silanes, siloxanes, alkylsilanes and alkoxysilanes. Specific examples of suitable structure former precursors include diethoxymethylsilane (DEMS), methyltriethoxysilane (MTEOS), methyltrimethoxysilane (MTMOS), methyldimethoxysilane (MDMOS), trimethylmethoxysilane (TMMOS), dimethyldimethoxysilane (DMDMOS), octamethylcyclotetrasiloxane (OMCTS), tetramethylcyclotetrasiloxane (TMCTS), trimethylsilylacetylene (TMSA), bis(trimethylsilyl)acetylene (BTMSA), vinylmethyldimethoxysilane (VMDMOS), methyldimethoxysilaneacetylene (MDMSA), methyldiethoxysilaneacetylene (MDESA), dimethylmethoxysilaneacetylene (DMMSA), dimethylethoxysilaneacetylene (DMESA), methylethoxysilane-di-acetylene (MESDA), divinylmethylethoxysilane (DVMEOS), 5-(bicycloheptenyl)methyldimethoxysilane (BMDS), 5-(bicycloheptenyl)triethoxysilane (BTS), 5-(bicycloheptenyl)diethoxysilaneacetylene (BDS) and derivative thereof.

Regarding possible porogen precursors, any chemical compound suitable for removal and creation of voids in a dielectric backbone network film can be used. As indicated previously, the porogen precursor is typically a hydrocarbon. One or more type(s) of porogen precursor compound(s) may be used. One preferred class of porogen precursor is polyfunctional cyclic non-aromatic compounds. Specific examples of suitable porogen precursors include alpha-terpinene (ATRP), limonene ($C_{10}H_{16}$), 5-ethylidene-2-norbornene (ENB), 8,8-dimethylfulvene (DMF), beta-pinene (BP), 1,2,3,4-tetramethyl-1,3-cyclopentadiene (TMCP) ($C_9H_{14}$) and derivates thereof.

Thus, the precursor film formation process can produce any number of various silicon-based and organic-based species. Any of a number of these species can then adhere to the internal surfaces of the reaction chamber. The chemical structure of these species will depend upon the structure former precursors and/or porogen precursors used and the methods and conditions used to form to the precursor film.

Once the ULK precursor film is deposited, the second phase of porous ULK film formation is implemented, the porogen removal phase. The porogen removal process typically occurs in a separate reaction chamber than the precursor film formation process. Common techniques include thermal processes, plasma mediated processes and UV mediated processes. Thermal processes involve heating the substrate to a temperature sufficient to volatilize the porogen, or sufficient to thermally break down the porogen into volatile species. Substrate temperatures are typically preferably below 400° C. so as to prevent damage to the integrated circuit device. Plasma mediated processes involve exposing the precursor film to a plasma, typically an oxidative plasma, that will chemically react with the porogen to also break down the porogen into volatile components. UV mediated processes involve exposing the precursor film to UV radiation in a manner sufficient to also break down and volatilize the porogen.

Referring back to FIG. 1, once the CVD chamber with ULK film precursor residues is provided, an oxidizing plasma treatment is implemented to clean the residues from the chamber (block 103). Note that the CVD chamber is any reaction chamber capable of providing and maintaining a plasma. An example of a suitable apparatus is described below with reference to FIG. 7. In another embodiment of the invention, a remote plasma source could be used to pre-dissociate the source gases outside the CVD chamber, while simultaneously a plasma is maintained inside the CVD chamber.

In preferred embodiments, the oxidizing plasma treatment involves the use of oxygen-containing and fluorine-containing source gases. The oxygen-containing and fluorine-containing gases, when introduced into the plasma, will dissociate into highly reactive species such as fluorine and oxygen ions and radicals. These reactive species chemically attack the residues on the chamber surfaces by oxidizing and breaking them down into volatile products. The break-down products, which include any of a number of derivatives of the silicon-based and organic-based ULK film precursor residue, are carried away from the chamber surfaces by the flow of gases and plasma conditions and pumped away by vacuum pump.

Examples of oxygen-containing source gases include $O_2$ and $N_2O$. Examples of fluorine-containing source gases include $NF_3$, $F_2$, $C_2F_6$, $C_3F_8$, $C_4F_8$, $C_4F_8O$, and $CF_4$. The flow rates of the different source gases, the total chamber pressures and plasma frequencies and powers can vary depending upon a number of factors and appropriate values can be readily determined by skilled practitioners given this disclosure. In one specific example, $NF_3$ and $O_2$ were used as source gases and the preferred amounts ranged between about 20 mol % and 35 mol % of $NF_3$ in $O_2$ (e.g., a 33 mol % $NF_3/O_2$). Such source gas combination are effective at rapidly removing the residue from the chamber following the deposition of ULK materials with a high etch rate (e.g., at least 1100 Å/min) in a single operation. The total chamber pressure preferably ranges between about 0.3 Torr and about 10 Torr. The plasma is preferably produced using high frequency power of between about 400 Watts and about 10000 Watts, or between about 100 Watts and about 2500 Watts per showerhead.

Returning to FIG. 1, during the oxidizing plasma treatment mentioned above, the optical emissions of atomic or molecular species correlated to the removal of the organic-based residues are monitored (block 105). This monitoring process depends on the general principle that atomic or molecular species (e.g., ionic, neutral or radical species), when excited, such as by the energy of a plasma, will release light. Each atomic or molecular species will emit light of one or more characteristic wavelengths. Thus, when a plasma is ignited and sustained, the presence or absence of a particular atomic or molecular species can be established by examining the light emitted from the plasma and determining whether the one or more characteristic wavelengths associated with the atomic or molecular species is being emitted. In addition, the intensity of the one or more characteristic wavelengths associated with the atomic or molecular species is proportionally related to the amount of the atomic or molecular species present in the plasma.

Figure 2:
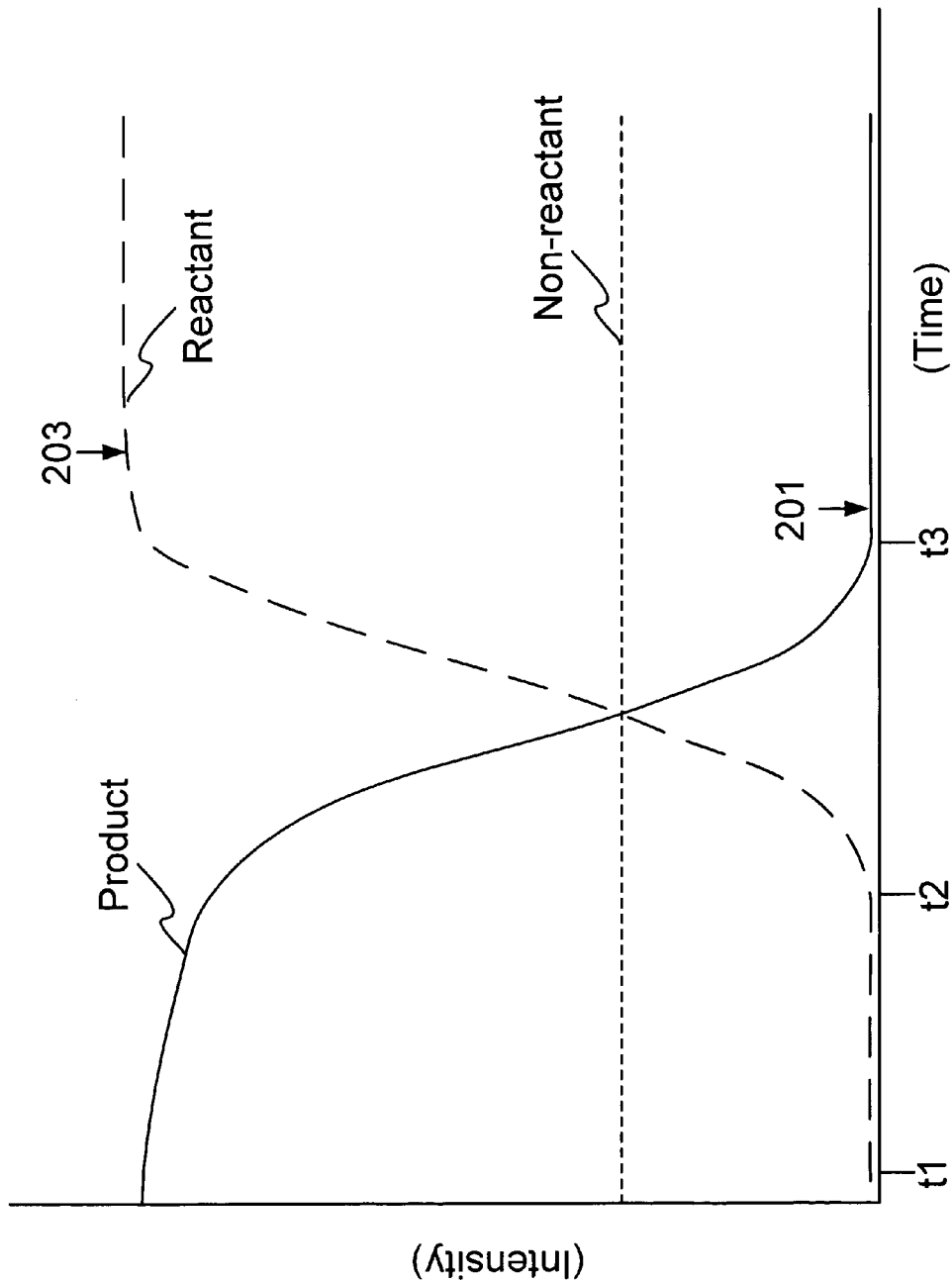
FIG. 2 is a graph showing a generic optical emission intensity profile for a plasma chamber cleaning process.

FIG. 2 shows a graph to demonstrate how one can monitor the intensity of emissions from atomic or molecular species to determine the relative amount of atomic or molecular species present during a plasma chamber cleaning process. This graph is a simplified generic intensity profile showing the intensity profiles of emission lines corresponding to a product (solid line), a reactant (long dashed line) and a non-reactant (short dashed line) over the duration of a plasma chamber clean. As described previously, oxidative chamber cleaning plasma processes can involve the use of fluorine-containing and oxygen-containing source gases, which will produce reactive ionic and radical species such as fluorine and oxygen ions and radicals and which will react with the residues on the chamber internal surfaces. These fluorine and oxygen ions and radicals are thus "reactants" in the plasma cleaning process. The fluorine radicals can react with the silicon-based residues and break them down into volatile derivatives such as $SiF_4$ and HF. The fluorine radicals can also react with the organic-based residue to form volatile derivatives such as $CF_4$ and HF. Similarly, oxygen radicals can react with the organic-based residue, forming volatile products such as CO, $CO_2$, and $H_2O$. Both oxygen and fluorine can also react with the organic-based residues to form $COF_2$. In addition, nitrogen radicals (generated from the plasma dissociation of $NF_3$) can react with the oxygen in the deposition residue to form volatile NO. These volatile derivatives resulting from the break down of the residues, when subjected to the plasma conditions, will dissociate and form various ionic and radical species. Thus, species such as $SiF_3^+$, $CF_3^+$, $COF^+$, $H_2O^+$, $HF^+$, $CO_2^+$, $CO^+$ and H will also be present in the plasma. These species associated with the reaction of the fluorine and oxygen with the silicon-based and organic-based residues are "products" of the plasma cleaning process, as shown in FIG. 2. Other "non-reactant" species, such as those derived from an inert background gas such as atomic argon (Ar), may also be detected. Note that not all species within the plasma will be able to emit sufficient light to be detected using optical emission methods.

The graph of FIG. 2 shows that the intensity of an optical emission line of a reactant (e.g., a fluorine radical, F) at the beginning of the plasma treatment (t1) is low. This is because at the beginning of the plasma treatment, reactants are being largely consumed by reaction with the residues and remain below their detection limits. In addition, the intensity of an optical emission line of a product (e.g., atomic hydrogen, H) at the beginning of the plasma treatment (t1) is high since there is an abundance of residues on the chamber surfaces for the reactants to react with to produce products. As the plasma treatment continues and the chamber residues are removed, the intensity of the product emission line begins to drop off while the reactant emission line starts to increase (t2). As the plasma treatment continues further, the intensity of the product emission line continues to diminish and begins to level off at t3 to a low intensity steady state level (201). Similarly, the reactant emission line continues to increase and begins to level off at t3 to a high intensity steady state level (203). The low intensity steady state emission line of the product and the high intensity steady state emission line of the reactant at t3 indicate that the residues have been fully consumed, i.e., t3 is the endpoint of the plasma cleaning process. It should be noted that the point where the reactants reach a high steady state level does not necessarily occur at the same point where the products reach low steady state levels. Indeed, in many cases the reactants may reach a high steady state value before the products reach a low steady state value. Note also the intensity of the optical emission line of the non-reactant (e.g., Ar) remains at a steady state throughout the plasma process.

We have discovered that the optical emissions of species during plasma cleaning of chambers with silicon-based and organic-based residues associated with ULK film precursor processes exhibit two distinct endpoints. A first endpoint corresponds to removal of silicon-based residues and a second endpoint corresponds to the removal of organic-based residues. The first endpoint occurs at an earlier time than the second endpoint. The observation of these two distinct endpoints is unique and unexpected and has not been observed in any previous chamber cleaning endpoint methods. While traditionally monitored optical emission lines (NO at 260 nm and F at 704 nm) are effective for determining the first endpoint (corresponding to removal of the Si-based residue), they are completely ineffective in determining the second endpoint (corresponding to removal of the organic-based residue). More specifically, it has been found that using these silicon-based residue removal endpoint methods will lead to significant undercleaning of the CVD chamber and the accumulation of unremoved deposition residue. The accumulation of unremoved deposition residue will result in particle issues and more frequent wet cleans.

The methods of the present invention are particularly focused on detecting the endpoint of removal of the organic-based residues, after the silicon-based residues have been removed. It has been discovered that optical emission lines of the atomic hydrogen (H) product are well suited for determining the second endpoint. The emission lines of atomic hydrogen can be correlated to products of the oxidation of the organic-based residues. Thus, in preferred embodiments, atomic hydrogen emissions lines are used to determine the endpoint of organic-based residue removal. To a lesser extent, the emission lines of carbon monoxide (CO) have also been found to correspond well to the organic-based residue removal. The preference for the emission lines of atomic H over the emission lines of CO is based on correlations observed between optical emission data and data collected with a chamber mounted mass spectrometer. A more detailed description of these findings are provided in the examples below.

Note that any one species within the plasma may emit more than one wavelength of detectable emission lines and one can choose what wavelengths of each species to monitor. In preferred embodiments, the wavelengths that result in the strongest emissions lines for the species being monitored are chosen. For example, radicals of atomic hydrogen (H) has strong detectable optical emission lines at 486 nm and at 656 nm. For CO, an optical emission line at 484 nm is strong. Thus, in preferred embodiments, the H and/or CO optical emissions at these stronger intensity wavelengths are chosen for monitoring.

One analysis technique that may be used to account for background drift of the spectrometer and to increase the percentage change of the optical emission signal at endpoint is a product-to-reactant or reactant-to-product ratio technique. As shown by FIG. 2, the decrease in the product intensity signal corresponds to the increase in reactant intensity signal. Thus, by monitoring the ratio of product intensity over the reactant intensity (product/reactant), the percentage decrease in the product emission signal will be amplified. Likewise, by monitoring the ratio of reactant intensity over the product intensity (reactant/product), the percentage increase in the reactant emission signal will be amplified. In preferred embodiments, the intensity of a hydrogen emission line signal over the intensity of a fluorine radical (H/F) emission line signal and/or the intensity of a hydrogen emission line signal over the intensity of an oxygen radical (H/O) is monitored. Preferred emission lines for F are at 704 nm and at 720 nm and preferred emission lines for O are at 616 nm and at 777 nm. The selected emission intensity ratio should be chosen such that individual emission lines have minimal overlap with background emission lines arising from other reactive or non-reactive species. Alternatively or additionally, the ratio of the intensity of one or more emission lines correlating to a product of the oxidation of the organic-based residues to the intensity of a region of the spectrum with no emission lines can be monitored.

Any of various known techniques for monitoring optical emissions may be used, including optical emissions spectrometry (OES) or photomultiplier tube detection. Any suitable device for monitoring optical emissions may be used, including an optical emission spectrometer or a photomultiplier tube detector (or multiple photomultiplier tube detectors). If a photomultiplier tube detector is used, it is preferably fitted with a bandpass filter to monitor a selected wavelength region. If multiple photomultiplier tubes are used, each is preferably fitted with its own bandpass filter to monitor separate wavelength regions. Note that multiple techniques and instruments may be also used simultaneously. Of course, the device(s) for monitoring the optical emissions should be situated with the reaction chamber in a manner that allows for the detection of the optical emissions of species from within the reaction chamber. An example of a suitable configuration will be described later.

It is worth mentioning that monitoring the intensity profiles of optical emissions of a plasma is not the only method that can be used to monitor the presence and abundance of species in a plasma. For example, a chamber mounted quadrupole mass spectrometer (QMS) can be used. The use of a QMS differs from optical emissions methods in that the mass spectrometer can directly detect the stable neutral species in the chamber whereas optical emissions methods detect the light that is emitted from the excited species in the plasma (a simple QMS cannot be used to detect the extremely short lived radicals and ions that are generated in a plasma). Thus, a QMS may detect any species that are generated within the reaction chamber whereas optical emissions methods detect those species that emit light. The use of a chamber mounted QMS, however, to determine chamber clean endpoints in a production environment is not practical. Quadrupole mass spectrometers are expensive, labor intensive, and subject to drift issues upon exposure to fluorine environments for extended periods of time. However, for short periods of time an internal standard (such as a low flow rate of Ar) may be used to account for variations in mass spectrometer sensitivities, variations in chamber pressure, and changes in the total molar flow rate that occur when the molecular source gases are fragmented and new gaseous species are formed. It is emphasized that the use of such normalized mass spectrometer ion signal intensities can account for such variations only for short periods of time. Thus a chamber mounted mass spectrometer cannot be used to endpoint CVD chamber cleans in a production environment. The present invention overcomes the challenges of using a chamber mounted QMS in a production environment by identifying unique plasma emission lines that can be used to simply, accurately, and reliably determine chamber clean times following the deposition of ULK film precursors in the semiconductor fabrication environment.

Although not the focus of the present invention, a chamber mounted QMS can be used in combination with atomic emissions methods. Indeed, initial concept and feasibility experiments for developing and confirming the accuracy of methods of the invention used normalized QMS ion signal intensity profiles. More specifically, the normalized QMS ion signal intensity profiles corresponding to $SiF_4$, HF, $CO_2$; $N_2O$, $CF_4$, $COF_2$, $H_2O$, and CO; $N_2$ were directly compared to emission intensity profiles. Details regarding some of these experiments are presented below with reference to FIGS. 4A-4C and 5A-5B.

Referring back to FIG. 1, once the endpoint of removing organic residues from the CVD chamber is determined, the plasma treatment is stopped and the process of FIG. 1 is complete. The CVD chamber may then be used for further processes, including for example, another ULK film precursor production process.

EXAMPLES

The following examples are presented to help illustrate aspects of the invention. It should be understood that these examples are representative only, and that the invention is not limited by the detail set forth in these examples. Note also that the following examples do not necessarily represent optimized conditions for endpoint detection of a plasma cleaning process in accordance with the invention.

Figure 3A:
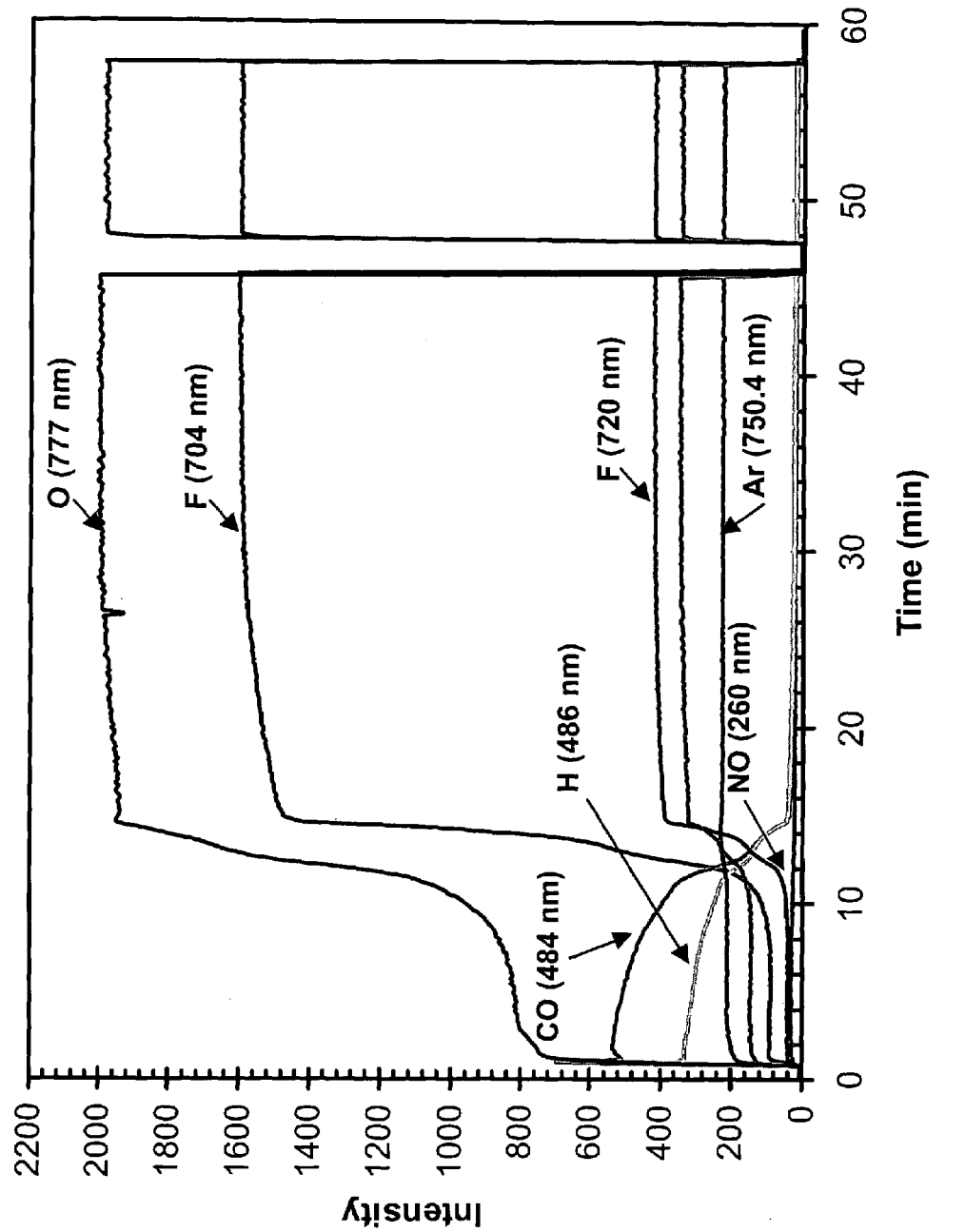
FIGS. 3A and 3B are optical emission intensity profiles of selected emission lines for a plasma chamber cleaning process using methods of the invention.
Figure 3B:
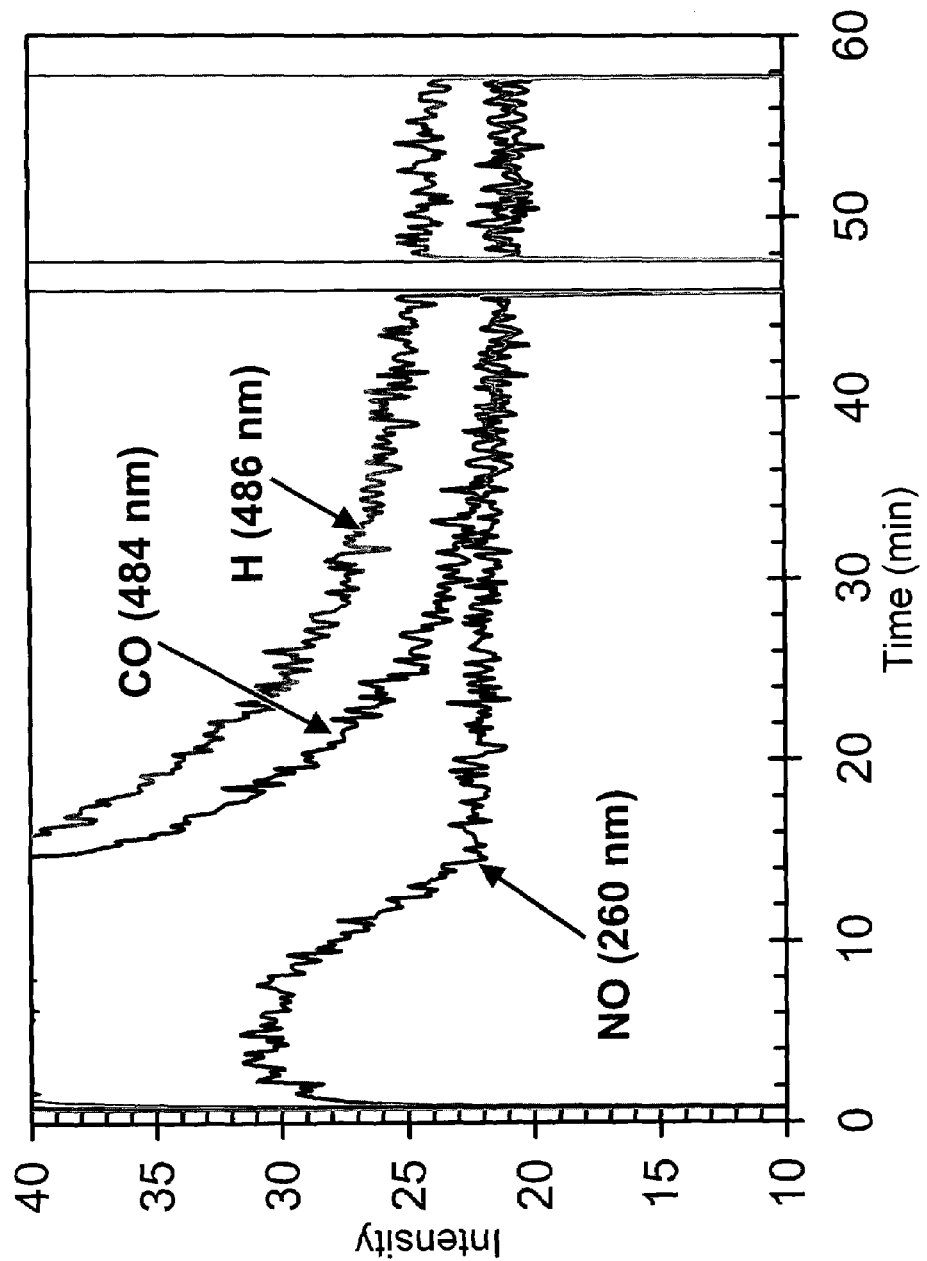

FIGS. 3A and 3B show optical emissions intensity profiles of selected emission lines using an optical emission spectrometer during plasma chamber cleaning processes using $NF_3$ and $O_2$ source gases. The graphs show the relative optical emission intensities (arbitrary units) of different selected emissions lines as functions of time in minutes. During the plasma process, the high frequency plasma power was evenly divided among four showerheads with 1125 Watts supplied to each showerhead. No low frequency power was used. The $NF_3$ flow rate was 800 sccm and the $O_2$ flow rate was 1600 sccm. A low flow rate of argon (75 sccm) was introduced into the chamber for use as an actinometer for analysis of the optical emissions data (and as an internal standard for analysis of the mass spectrometer data that was collected simultaneously). The chamber operating pressure was 0.35 Torr.

FIG. 3A shows intensity profile lines for an oxygen emission at 777 nm (labeled "O (777 nm)"), a fluorine emission at 704 nm (labeled "F (704 nm)"), a fluorine emission at 720 m (labeled "F (720 nm)"), a carbon monoxide emission at 484 nm (labeled "CO (484 nm)"), a hydrogen emission at 486 nm (labeled "H (486 nm)"), a nitric oxide emission at 260 nm (labeled "NO (260 nm)") and an argon emission at 750.4 nm (labeled "Ar (750.4 nm)"). Note that at about 45 minutes processing time, all the intensity profile emission lines drop to zero and then return to normal intensities at about 48 minutes. This is an artifact of the process recipe used for the plasma treatment. Specifically, a 45 minute plasma process recipe was used and the plasma was turned off at this time. However, the plasma was turned back on at about 48 minutes and the plasma cleaning process was continued for 10 more minutes to show completeness of the plasma cleaning process.

As described previously, the intensity profile emission lines for reactants will increase during the plasma cleaning process while the intensity profile emission lines for products will decrease. Thus, as shown in FIG. 3A, O (777 nm), F (704 nm) and F (720 nm) are reactants, and CO (484 nm) and H (486 nm) are products. The intensity profile of the background gas Ar (750.4 nm) remains relatively flat and unchanged throughout treatment. Although on the scale of FIG. 3A the NO (260 nm) emission intensity profile appears to be flat, this species is also actually a product as well, which will be more clearly shown in FIG. 3B. Note that the NO (260 nm) product correlates to removal of the silicon-based residues while the CO (484 nm) and H (486 nm) products correlate to removal of the organic-based residues. A more detailed description of how these products were correlated to the removal of silicon-based and organic-based residues will be described later with respect to FIGS. 4A and 4B.

FIG. 3B is an enlarged portion of the graph of FIG. 3A, specifically, the portion corresponding to emission intensities between 10 and 40 on the relative intensity scale of FIG. 3A. Thus, FIG. 3B shows smaller changes in emission intensities compared to FIG. 3A over the plasma treatment time. As shown, the CO (484 nm) and H (486 nm) emission profiles actually decrease more gradually than as indicated by FIG. 3A. For example, FIG. 3B shows that the H (486 nm) emission line is still decreasing during the time period between 15 and 30 minutes and does not appear to reach a low steady state intensity until about 40-45 minutes of plasma treatment. FIG. 3A, on the other hand, shows the H (486 nm) emission line appears to reach a low steady state after about 17 minutes of plasma treatment. However, the latter is simply an artifact of the large range of the intensity scale used in FIG. 3A. Similarly, as shown by FIG. 3B, the CO (484 nm) emission line also does not appear to reach a low steady state intensity until about 40 minutes of plasma treatment.

As noted previously, FIG. 3B shows that the NO (260 nm) emission line is actually not flat (as suggested by FIG. 3A) but shows the characteristic profile of a product species. Note the different behavior of the H (486 nm) emission intensity profile compared to the NO (260 nm) emission intensity profile. After about 20 minutes, the emission intensity profile of NO (260 nm) does not show any significant changes as a function of time. This can be viewed as the previously described first endpoint, corresponding to removal of the silicon-based residues. However, at 20 minutes, the H (486 nm) emission intensity profile continues to decrease until about 40-45 minutes of plasma treatment. This can be viewed as the second endpoint, corresponding to removal of the organic-based residues. This also indicates that this NO (260 nm) emission line is not appropriate for determining the second endpoint corresponding to removal of the organic-based residue. The CO (484 nm) emission line can also be used to determine the second endpoint but the H (486 nm) may be more preferable, as will be described later. Note that determining when the optical emission profile for an atomic species has reached a steady enough low level state is somewhat subjective. That is, one may consider that H (486 nm) emission line in FIG. 3B is still decreasing after 40-45 minutes and choose to stop plasma processing at a later time, say after 60 minutes. Practicality, process efficiency issues, film parameters, and particle adders should be considered when deciding appropriate process endpoints.

Figure 4A:
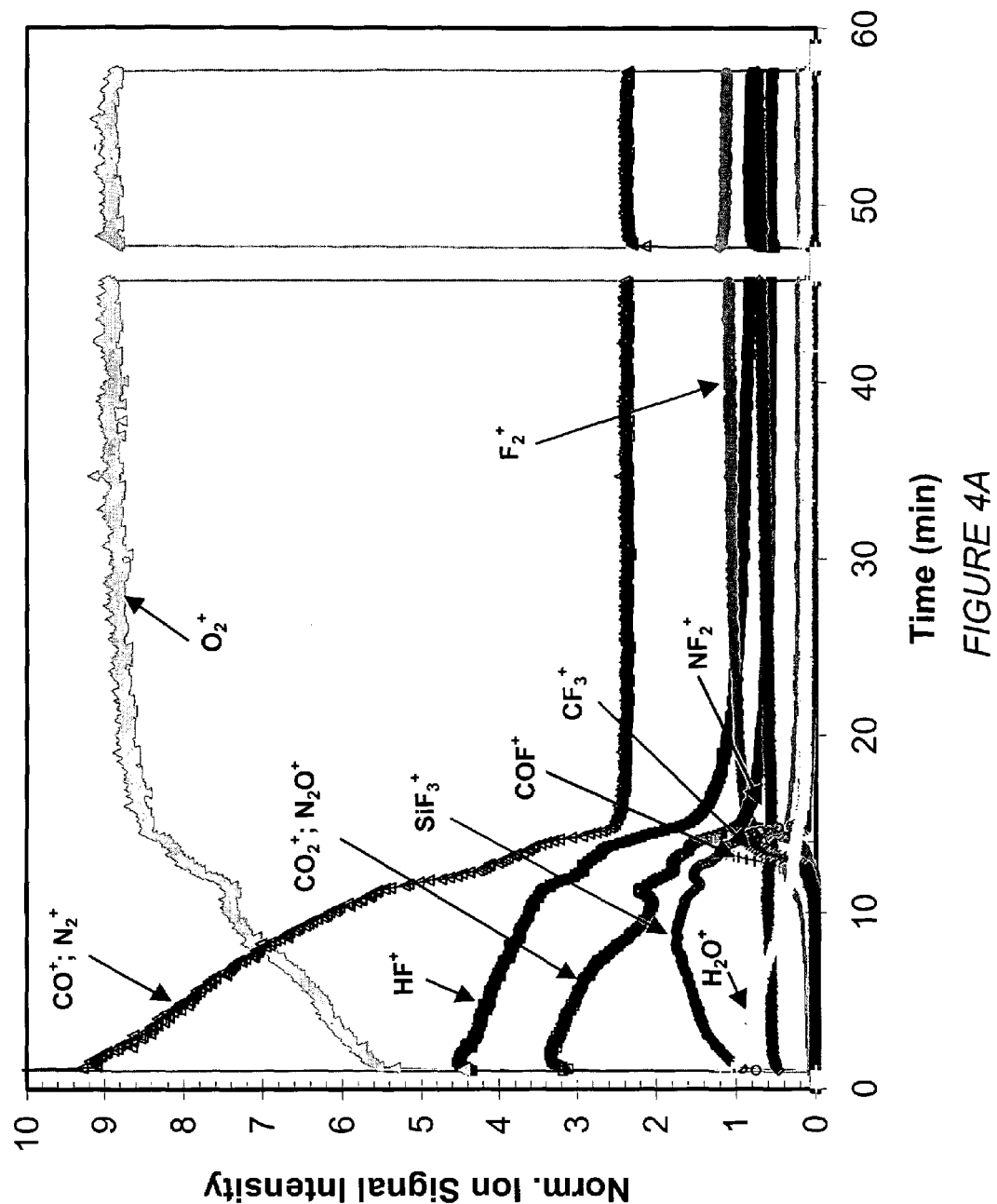
FIGS. 4A-4C are graphs showing correlations between normalized mass spectrometer ion intensity signal profiles with optical emission intensity profiles.
Figure 4B:
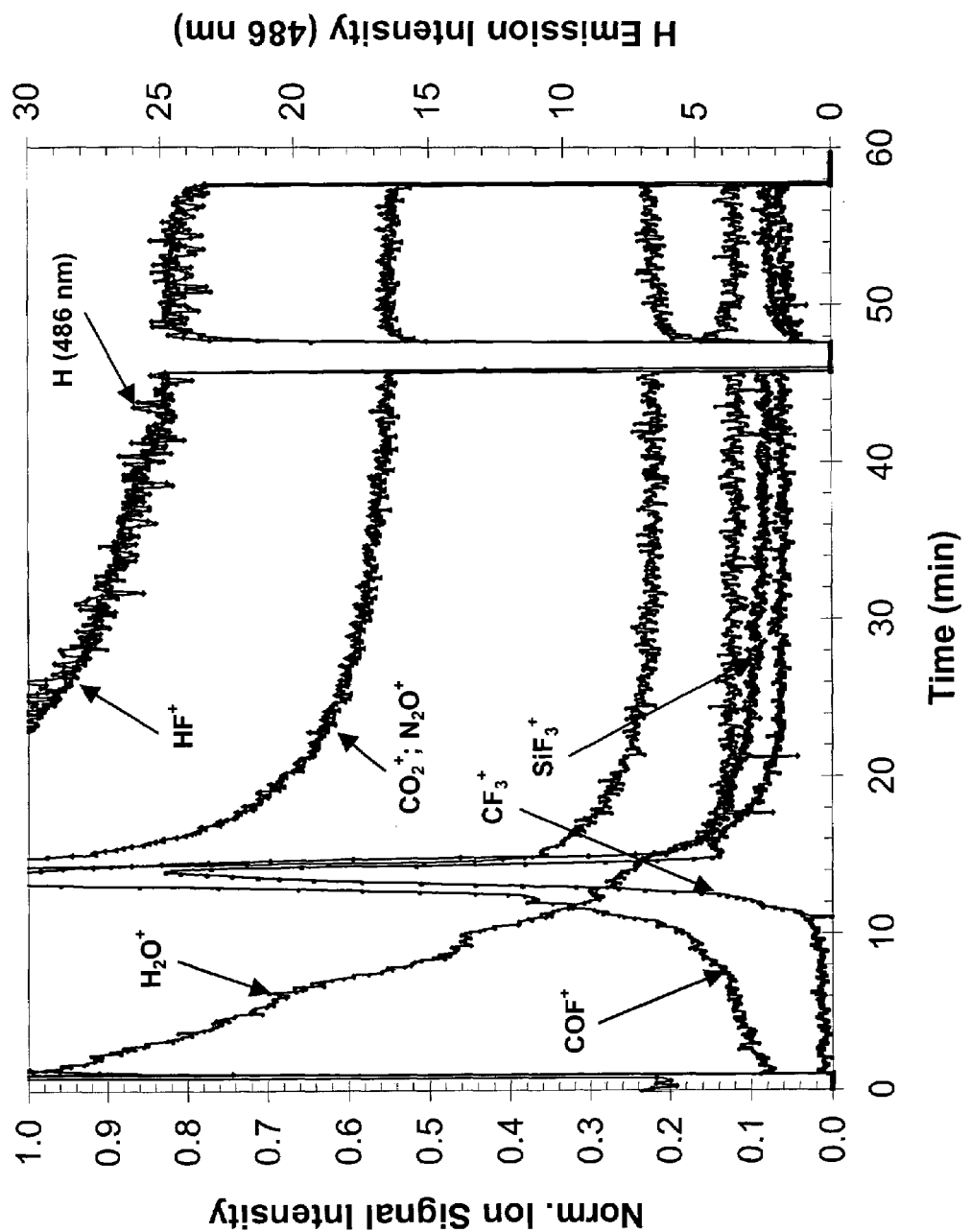
Figure 4C:
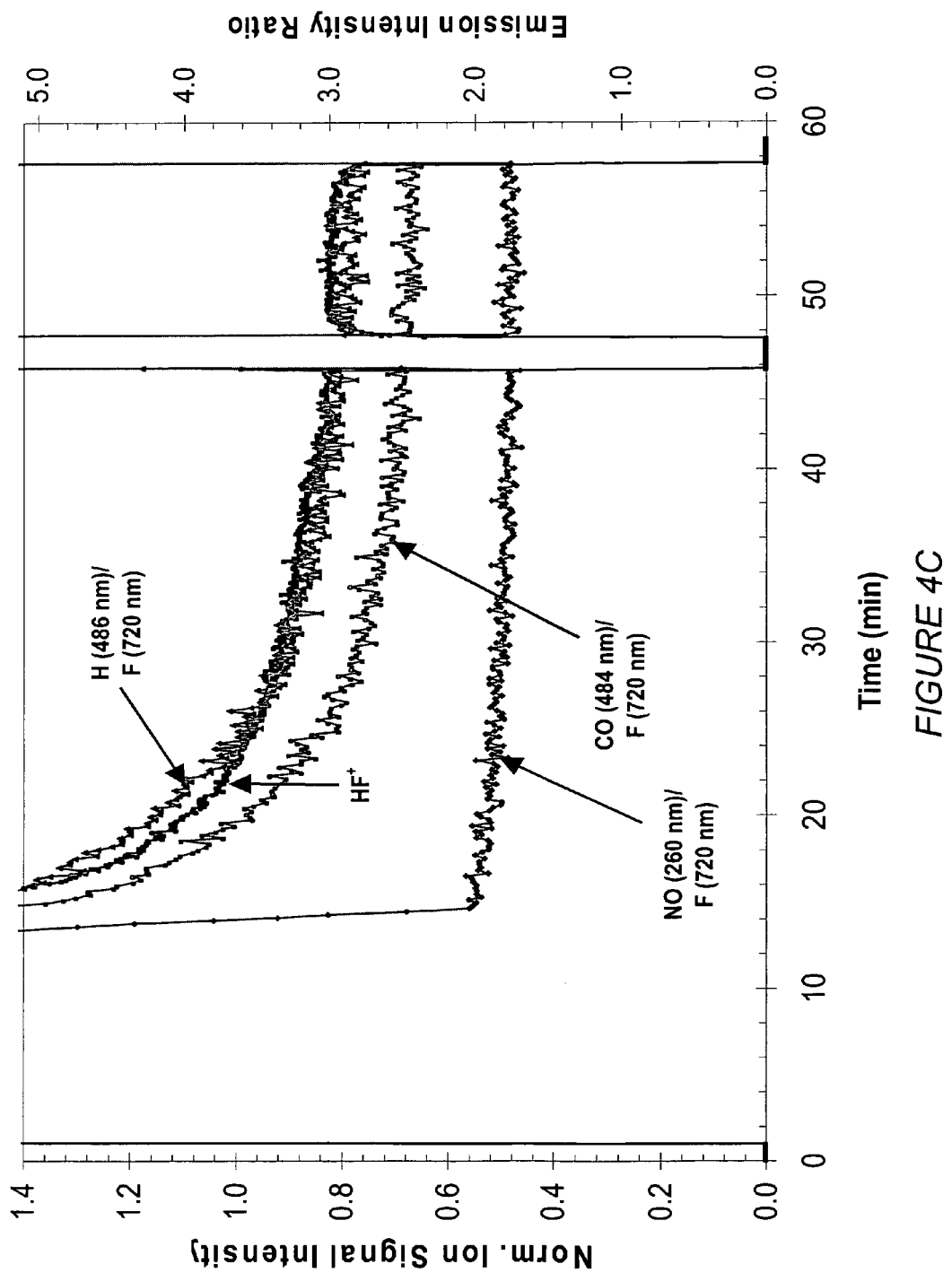

As described previously, a chamber mounted QMS can be used to identify virtually all stable neutral atomic and molecular species in a plasma whereas optical emission methods can only detect those species that sufficiently emit light. In this respect, a QMS can be used as a standard against optical emission methods to assure that all products of the plasma reaction have been removed from the chamber. FIGS. 4A-4C are graphs showing correlations between normalized QMS data and optical emissions data for $NF_3/O_2$ based chamber cleans following ULK film precursor deposition. The same plasma power and gas flow rates described for FIGS. 3A and 3B above were used in the plasma process for those of FIGS. 4A-4C.

FIG. 4A illustrates the normalized mass spectrometer ion signal intensity profiles during a $NF_3$ and $O_2$ plasma chamber cleaning process. As with the optical emission spectra of FIGS. 3A and 3B, there is a gap between 45 and 48 minutes as a result of the process recipes used. The shape of the mass spectrometry ion signal profiles are similar to those of the atomic optical emission profiles of FIGS. 3A and 3B in that the reactants (or species that can be correlated to the reactants) have characteristic increasing curves and products (or species that can be correlated to the products) have characteristic decreasing curves. For example, in FIG. 4A, the $O_2^+$ ($O_2^+$, at a m/e=32, is a primary ion fragment in the mass spectrum of $O_2$ at an electron impact energy of 35 eV) and $F_2^+$ ($F_2^+$, at a m/e=38, is a primary ion fragment of $F_2$) intensity profiles increase during the plasma treatment and can be correlated to reactants (as described below, the actual reactants are fluorine and oxygen radicals and ions). The $HF^+$ ($HF^+$, at a m/e=20, is a primary ion fragment of HF), $SiF_3^+$ ($SiF_3^+$, at a m/e=85, is a primary ion fragment of $SiF_4$), $CF_3^+$ ($CF_3^+$, at a m/e=69, is a primary ion fragment of $CF_4$), $COF^+$ ($COF^+$, at a m/e=47, is a primary ion fragment of $COF_2$), $H_2O^+$ ($H_2O^+$, at a m/e=18, is a primary ion fragment of $H_2O$), $CO_2^+$; $N_2O^+$ ($CO_2^+$ and $N_2O^+$, at a m/e=44, are primary ion fragments of $CO_2$ and $N_2O$), and $CO^+$; $N_2^+$ ($CO^+$ and $N_2^+$, at a m/e=28, are primary ion fragments of CO and $N_2$) ion intensity profiles all decrease during the plasma treatment and are thus products. Note that $CO_2^+$ and $N_2O^+$ occur at the same charge-to-mass ratio in a QMS (i.e., they both appear as a single signal in a QMS). Similarly, $CO^+$ and $N_2^+$ occur at the same charge-to-mass ratio in a QMS.

As shown in FIG. 4A, during the first twelve minutes of the plasma process, the ion signal intensity of $F_2^+$ remains below its mass spectrometry detection limit. Presumably almost all of the F atoms (i.e., F radicals) generated by dissociation of the $NF_3$ are consumed by reaction with the deposition residue during this period. As the clean progresses, less silicon-based residue is left in the chamber for the F radicals to react with, the excess F radicals recombine to form $F_2$, and the $F_2^+$ ion signal intensity begins to increase after about 12 minutes. The sharp increase in the $F_2^+$ ion signal intensity corresponds to a sharp decrease in the $SiF_3^+$ and $HF^+$ ion signal intensities. After about 20 minutes, the normalized $F_2^+$ ion signal intensity begins to approach a high steady state level. The $O_2^+$ ion signal intensity also suggests that as the clean progresses the reaction of O radicals with the deposition residue decreases (i.e., the $O_2^+$ ion signal intensity gradually increases and approaches a high steady state level after about 20 min). These trends suggest that after about 20 minutes the majority of the easily cleaned deposition residue has been removed from the chamber. The chamber is considered clean when the normalized ion signal intensities corresponding to all key products of the oxidation reaction of the residues (e.g., $HF^+$, $SiF_3^+$, $CF_3^+$, $COF^+$, $H_2O^+$, $CO_2^+$; $N_2O^+$, and $CO^+$; $N_2^+$) have decreased to low steady state levels that are no longer changing as a function of time.

FIG. 4B shows an enlarged portion of the graph of FIG. 4A, specifically, the portion corresponding to emission intensities between 0 and 1 on the normalized ion signal intensity scale of FIG. 4A. This graph shows that even after about 20 minutes the $HF^+$ and $CO_2^+$; $N_2O^+$ ion signals are still significantly decreasing, indicating the persistence of residue in the chamber after 20 minutes. After about 20 minutes, the ion signal intensities of $SiF_3^+$, $CF_3^+$, $COF_2^+$, and $H_2O^+$ have significantly decreased and are approaching low steady state values. This can be viewed as a "first" endpoint, corresponding to removal of the Si-based residue. However, an examination of the mass spectrometry profiles clearly shows that after about 20 minutes both the $HF^+$ and $CO_2^+$; $N_2O^+$ ion signal intensities are still significantly decreasing, indicating that organic-based residues are still being removed from the chamber. Indeed it is not until about 55 minutes that the $HF^+$ and $CO_2^+$; $N_2O^+$ ion signal intensities can be seen to approach low steady state levels. The point where the $HF^+$ and $CO_2^+$; $N_2O^+$ ion signal intensities reach low steady state values can be defined as the second endpoint, corresponding to removal of the organic-based residue. Failure to clean to the second endpoint will result in residue buildup, particle issues resulting from the accumulation of unremoved deposition residue, and more frequent wet cleans.

FIG. 4B also shows an overlay of the optical emission intensity profile of the H (486 nm) emission line. This H (486 nm) optical emission line is overlaid to temporally match the normalized mass spectrometer ion intensity signals. A unique aspect that was discovered was that the emission lines of atomic hydrogen (e.g., H (486 nm)) and the $HF^+$ ion mass spectrometer intensity signal almost exactly overlap temporally and correspond in time with respect to decaying to a low steady state level after approximately 20 minutes into the plasma cleaning process. This helped to lead to the idea that the optical emission lines of atomic hydrogen are good indicators to optically endpoint fluorine and oxygen based plasma chamber cleaning processes following the processing of ULK film precursors. As described previously, the hydrogen over fluorine or hydrogen over oxygen emission intensity ratios, as well as the emission intensity ratio of atomic hydrogen to emission intensity of an inert diluent or background region with no obvious interferences, can also be used and may be better suited in some cases for endpointing the cleaning process. Emission intensity ratios have the advantage of correcting for background drift in the spectrometer that can occur during the CVD chamber clean. Consequently the use of H emission intensity ratios are preferred over the use of uncorrected H emission intensities for endpointing chamber cleans following the deposition of ULK film precursors. It is important to note that in general the normalized QMS ion signal intensity profiles show that the $HF^+$ ion signal intensity is the last ion signal intensity to reach a low steady state value during a chamber clean. Since the $HF^+$ ion signal intensity shows an almost exact correlation with emission lines of atomic hydrogen, the emission lines of atomic hydrogen are preferred over the emission lines of CO for endpointing CVD chamber cleans following the deposition of ULK film precursors.

FIG. 4C shows the same normalized $HF^+$ mass spectrometer ion intensity signal profile in FIG. 4B overlaid with several optical emissions intensity profiles. Specifically, the intensity profile of $HF^+$ is overlaid with the H (486 nm)/F (720 nm), NO (260 nm)/F (720 nm) and CO (484 nm)/F (720 nm) optical emission ratio profiles. Just as with the uncorrected H (486 nm) emission line, the profile of the H (486 nm)/F (720 nm) emission intensity ratio correlates almost exactly with the normalized $HF^+$ ion signal intensity after about 20 minutes into the plasma process. Thus as shown the H (486 nm)/F (720 nm) ratio is well suited for endpointing the plasma cleaning process. In contrast, the NO (260 nm)/F (720 nm) emission intensity ratio has no obvious correlation with the normalized $HF^+$ ion signal intensity, and thus is not well suited for endpointing the chamber cleaning process. Note that the CO (484 nm)/F (720 nm) optical emission ratio could also be used to endpoint the chamber cleaning process.

Figure 5A:
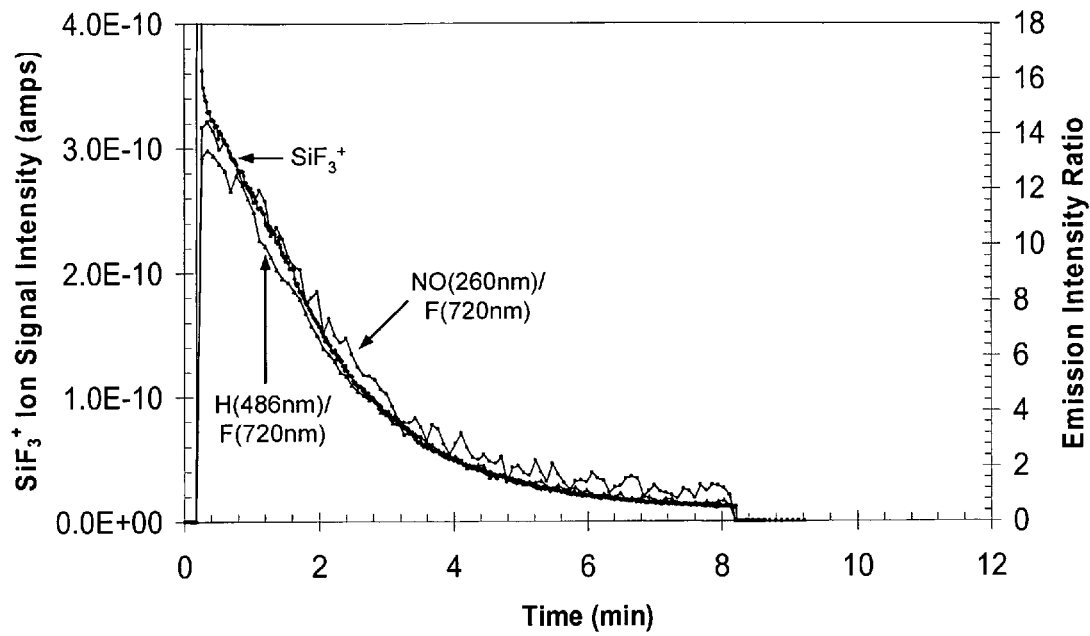
FIGS. 5A and 5B are graphs showing selected normalized mass spectrometer ion intensity signal profiles and optical emissions intensity profiles for plasma chamber cleaning processes, wherein the chamber had non-porogen organic-based residues therein.
Figure 5B:
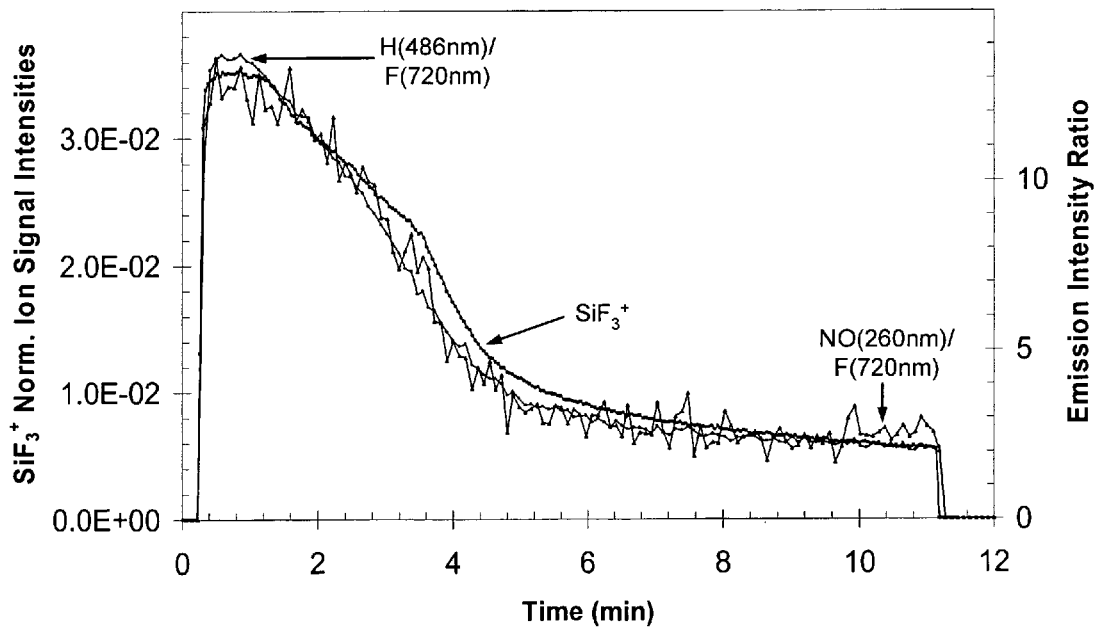

FIGS. 5A and 5B show two overlay mass spectrometer ion intensity signal profile and optical emissions intensity profile graphs. FIG. 5A shows data from a plasma chamber clean following a TEOS film deposition. TEOS is a standard precursor used to produce non-carbon-doped silicon-based oxide films used as insulating material in semiconductor devices. FIG. 5B shows data from a plasma chamber clean following a TMCTS (tetramethylcyclotetrasiloxane) film deposition. For this deposition process TMCTS is used as the precursor in creating a non-porous carbon-doped oxide film. Neither of these TEOS and TMCTS films are porous ULK type films. Thus, the plasma chamber cleaning processes presented in both FIGS. 5A and 5B are of chambers that do not have porogen-related residues formed thereon. Note that for TEOS depositions, organic fragments are incorporated into the film deposition residue inside the CVD chamber. For non-porous carbon-doped oxide TMCTS-based film depositions, significant fractions of organic fragments can be incorporated into the film deposition residue inside the CVD chamber. Indeed the elemental composition of the deposition residue following a non-porous carbon-doped oxide TMCTS-based deposition may be similar to the elemental composition of the deposition residue following a ULK film precursor deposition. Interestingly, the plasma treatment times following TEOS depositions and non-porous carbon-doped oxide TMCTS-based depositions are dictated by removal of the silicon-based residue and do not need to factor in removal of organic-based residue that is present. This is an important factor differentiating chamber cleans following the deposition of non-porous CDO's from chamber cleans following the deposition of ULK film precursors. Similar plasma conditions and source gases as used in the plasma processes of FIGS. 3A and 3B were used.

FIGS. 5A and 5B overlay the $SiF_3^+$ mass spectrometer ion intensity signal profile with the H (486 nm)/F (720 nm) and NO (260 nm)/F (720 nm) optical emissions intensity profiles. The $SiF_3^+$ ion signal intensity is considered a reliable reference to determining the endpoint of removing silicon-based residues from the chamber. As shown, both the H (486 nm)/F (720 nm) and NO (260 nm)/F (720 nm) emission lines follow nearly identical trends and reach low steady states at the same time (i.e., at about 8 minutes). Thus for these films either the H (486 nm)/F (720 nm) and NO (260 nm)/F (720 nm) emission intensity ratios could be used to endpoint the chamber clean. This is very different than the behavior observed for chamber cleans following ULK precursor film deposition, as shown in FIGS. 3B and 4C. For chamber cleans following ULK precursor film depositions the NO and H emission lines reach low level steady state values at distinctly different times. These data clearly indicate that incorporation of the porogen, as part of the ULK film precursor formation process, results in particular organic-based residues within the reaction chamber that are very different than the organic-based residues within the reaction chamber following TEOS or non-porous TMCTS-based carbon-doped oxide depositions. Thus, as is clearly apparent by comparing FIGS. 3B, 4B, and 4C with FIGS. 5A and 5B, previously known endpoint techniques (i.e., using NO emissions signal) for removing deposition residues from the chamber cannot be used to endpoint CVD chamber cleans following the ULK film precursor depositions.

FIG. 6 shows the optical emission spectra between 625 nm and 675 nm at various times during a 45 minute $NF_3/O_2$ in plasma chamber cleaning process. This graph shows one of the wavelengths at which H emits most strongly and illustrates how the optimal wavelengths for H were chosen. As shown, H has strongly an emitting wavelength at 656 nm that does not overlap with the wavelengths of other emitting species in the plasma. Note that F also has emitting wavelengths at 635 nm and 641 nm. This graph also shows the change in intensity of the wavelengths as a function of plasma process time, i.e., at 2.7, 13, 16, 25 and 40 minutes. Note that the H (656 nm) optical emission intensity decreases and the F (635 nm and 641 nm) atom emission intensity increases as the plasma process time increases.

Apparatus

The present invention is preferably implemented in a plasma enhanced chemical vapor deposition (PECVD) reactor. Such a reactor may take many different forms. For certain operations in which the wafer may be heated, the apparatus may include a heating platen. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In a preferred embodiment of the invention, a Vector™ or Sequel™ reactor, produced by Novellus Systems of San Jose, Calif., may be used to implement the invention.

Figure 7:
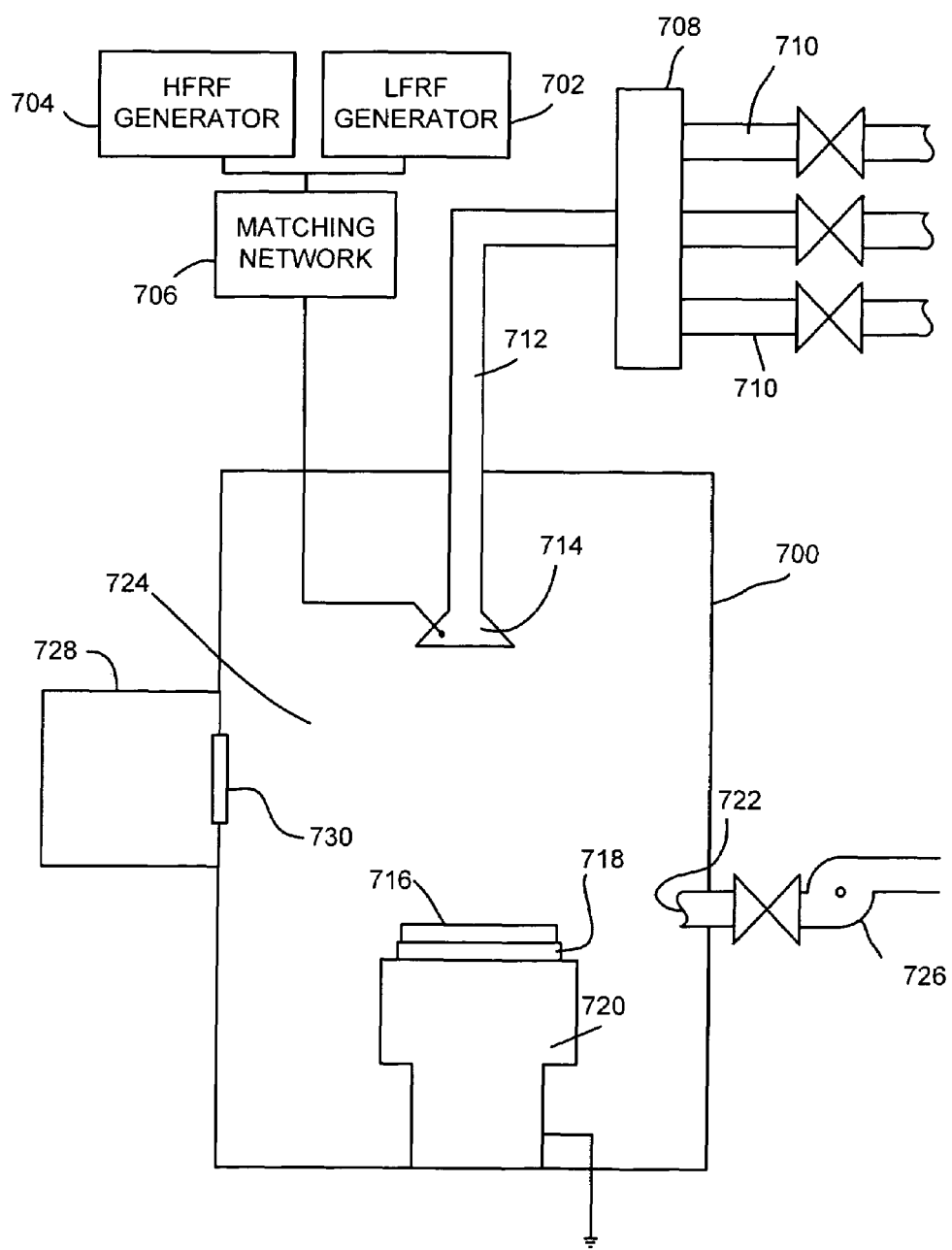
FIG. 7 is a schematic representation of apparatus suitable for the endpoint detection methods in accordance with certain embodiments of this invention.

FIG. 7 provides a simple block diagram depicting various reactor components arranged for implementing the present invention. As shown, reactor 700 includes a process chamber 724, which encloses other components of the reactor and serves to contain the plasma generated by a capacitor type system including a showerhead 714 working in conjunction with a grounded heater block 720. A high-frequency RF generator 702, connected to a matching network 706, and a low-frequency RF generator 704 are connected to showerhead arrangement 714. Showerhead arrangement 714 may comprise a number of showerhead units. For example, in a specific embodiment there are four showerheads with the power equally split to each of the showerheads. The power and frequency supplied by matching network 706 is sufficient to generate a plasma from the process gas. In the implementation of the present invention only the HFRF generator is used. In a typical process, the high frequency RF component is generally between 2-60 MHz. In a preferred embodiment for a chamber cleaning process, a 4.5 kW power HF component of 13.56 MHz was used with the 4.5 kW power equally split to each of the four showerheads (i.e., ~1125 W to each showerhead).

Within the reactor, a wafer pedestal 718 supports a substrate 716. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 712. Multiple source gas lines 710 are connected to manifold 708. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 700 via an outlet 722. A vacuum pump 726 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Optical emission spectrometer 728 is mounted on reactor 700. Optical emission spectrometer 728 is positioned such that, during operation, light generated from the plasma within process chamber 724 will pass through window 730 for detection by optical emission spectrometer 728. In preferred embodiments, window 730 will be made of sapphire or other material that has good transmission characteristics over the ultraviolet, visible, and near IR spectrum while being chemically resistant. Note that for embodiments where a photomultiplier tube system is used, the photomultiplier tubes(s) should be similarly mounted on reactor 700 to allow light from the plasma to reach the photomultiplier tube(s).

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of determining the endpoint for cleaning a CVD chamber, the method comprising:

providing a CVD chamber with a device configured to monitor optical emission intensities from within the CVD chamber, the chamber having silicon-based and organic-based ULK precursor film residues on its internal surfaces;

exposing the residues on the interior surfaces of the CVD chamber to an oxidizing plasma treatment employing oxygen-containing and fluorine-containing source gases;

monitoring the intensity of one or more optical emission lines of one or more atomic and/or molecular species that are products of the oxidation of the organic-based residues and of one or more emission lines of a reactant of the oxidizing plasma treatment during the plasma exposure; and determining the substantially complete removal of the residues when the ratio of the optical emission intensity of the one or more species that are products of the oxidation of the organic-based residues to the one or more emission lines of a reactant of the oxidizing plasma treatment reaches a low steady state level.

2. The method of claim 1, wherein the oxygen-containing gas is $O_2$ and the fluorine-containing gas $NF_3$.

3. The method of claim 1, wherein the atomic species is atomic hydrogen.

4. The method of claim 1, wherein the molecular species is carbon monoxide.

5. The method of claim 1, wherein the reactant is one of atomic fluorine and atomic oxygen.

6. The method of claim 1, wherein the product is one of atomic hydrogen and carbon monoxide and the reactant is one of atomic fluorine and atomic oxygen.

7. The method of claim 1, wherein the product is atomic hydrogen and the reactant is one of atomic fluorine and atomic oxygen.

8. The method of claim 1, wherein the organic-based ULK precursor film residues originate from a polyfunctional cyclic non-aromatic porogen precursor.

9. The method of claim 1, wherein the organic-based ULK precursor film residues are from an alpha terpinene, a limonene or a norbornene porogen precursor.

10. The method of claim 1, wherein the flow rate of oxygen ranges between about 50 sccm and about 10000 sccm and the flow rate of fluorine ranges between about 50 sccm and about 10000 sccm.

11. The method of claim 1, wherein the chamber pressure during plasma treatment ranges between about 0.3 Torr and about 10 Torr.

12. The method of claim 1, wherein the plasma is produced using a high frequency power of between about 400 Watts and about 10000 Watts.

13. The method of claim 1, wherein the device configured to monitor optical emission intensities is an optical emission spectrometer or multiple photomultiplier tube detectors.

14. The method of claim 1, wherein the fluorine containing source gas is selected from the group consisting of $NF_3$, $F_2$, $CF_4$, $C_2F_6$, $C_3F_8$, $C_4F_8$ and/or $C_4F_8O$, and combinations thereof, and the oxygen containing source gas is selected from the group consisting of $O_2$, $NO_2$ and $O_3$, and combinations thereof.

15. The method of claim 1, wherein the source gases comprise a 33 mol % $NF_3/O_2$ gas mixture.

16. A method of determining the endpoint for cleaning a CVD chamber, the method comprising:

providing a CVD chamber with a device configured to monitor optical emission intensities from within the CVD chamber, the chamber having silicon-based and organic-based ULK precursor film residues on its internal surfaces;

exposing the residues on the interior surfaces of the CVD chamber to an oxidizing plasma treatment employing oxygen-containing and fluorine-containing source gases and an inert background gas;

monitoring the intensity of one or more optical emission lines of one or more atomic and/or molecular species that are products of the oxidation of the organic-based residues and of one or more emission lines of a species originating from the inert background gas during the plasma exposure; and determining the substantially complete removal of the residues when the ratio of the optical emission intensity of the one or more species that are products of the oxidation of the organic-based residues to the one or more emission lines of a species originating from the inert background gas reaches a low steady state level.

17. The method of claim 16, wherein the inert background gas comprises argon, helium, neon, krypton or a combination thereof.

18. The method of claim 16, wherein the product is atomic hydrogen and the inert background gas is argon.

19. The method of claim 16, wherein the flow rate of the inert background gas is less than or equal to 5% of the total gas flow rate.

* * * * *